United States Patent [19]

Nishi et al.

[11] 4,119,480

[45] Oct. 10, 1978

[54] METHOD OF MANUFACTURING THICK-FILM CIRCUIT DEVICES

[75] Inventors: Yusaku Nishi; Hideo Fujii, both of Ome, Japan

[73] Assignee: Tokyo Shibaura Electric Co., Ltd., Kawasaki, Japan

[21] Appl. No.: 795,446

[22] Filed: May 10, 1977

[30] Foreign Application Priority Data

May 13, 1976 [JP] Japan .................. 51-54532
May 13, 1976 [JP] Japan .................. 51-54533

[51] Int. Cl.² ........................................ B05D 3/06
[52] U.S. Cl. ..................... 156/272; 427/43; 427/96; 427/376 A; 427/376 E
[58] Field of Search ............ 427/43, 264, 265, 273, 427/277, 96, 375, 376 A, 376 E; 96/36.2; 156/272

[56] References Cited

U.S. PATENT DOCUMENTS

| 3,075,866 | 1/1963  | Baker et al. ............... 427/273 |
| 3,419,425 | 12/1968 | Conrad ..................... 427/273 |
| 3,575,746 | 4/1971  | Cheskis et al. ............. 427/273 |
| 3,661,635 | 5/1972  | Harrison ................... 427/273 |
| 3,712,825 | 1/1973  | Yocum ...................... 427/264 |
| 3,837,885 | 9/1974  | Angelucci .................. 96/36.1 |
| 3,853,560 | 12/1974 | Ohgoshi et al. ............. 96/36.1 |
| 3,958,996 | 5/1976  | Inskip ..................... 96/36.2 |
| 3,982,941 | 9/1976  | Inskip ..................... 96/36.2 |

FOREIGN PATENT DOCUMENTS 1,275,471 5/1972 United Kingdom ............ 96/36.2

OTHER PUBLICATIONS

Desai et al., "IBM Tech. Disc. Bull.", vol. 16, #8, Jan. 1974, pp. 2644–2645.

*Primary Examiner*—John H. Newsome
*Attorney, Agent, or Firm*—Oblon, Fisher, Spivak, McClelland & Maier

[57] ABSTRACT

A method of manufacturing thick-film circuit devices which comprises depositing a photosensitive resin on a substrate either before or after the deposition of a paste for thick-film circuit, exposing the photosensitive resin selectively to light and thereby forming a predetermined thick-film paste pattern, and then firing the paste pattern.

13 Claims, 13 Drawing Figures

METHOD OF MANUFACTURING THICK-FILM CIRCUIT DEVICES

BACKGROUND OF THE INVENTION

This invention relates to a method of manufacturing wiring device for mounting electronic components and, more particularly, to a method of manufacturing thick-film circuit device.

In order to mount electronic components such as semiconductor elements directly on a circuit device, ceramic substrates on which passive components and their interconnections are deposited in the form of a thick or thin film are commonly used. With the recent advancement of computer techniques, circuit device having a higher density of circuit have come to be demanded. Conventionally, the thick-film technique is used for the manufacture of circuit device of relatively low density of circuit having a wire width of 100μ or greater, while the thin-film technique is used for the manufacture of circuit device of high density of circuit having a wire width of less than 100μ. The thick-film technique involves a printing process similar to stencil printing in which a circuit pattern is formed by depositing an electrically conductive or insulating paste for thick-film circuit through a fine mesh screen having a desired pattern baked thereon. This thick-film printing method is useful, as described above, for the formation of circuit patterns having a wire width of 100μ or greater, but has been found to have a number of disadvantages in forming circuit patterns with a smaller wire width. That is, the screen of commonly used type which consists of a mesh work made of fine stainless steel wire has certain limits imposed on the spacing of the meshwork and the thickness of the stainless steel wire, because of the strength requirements for the screen. Thus, the presence of the screen itself constitutes a serious obstacle as the wire width of the circuit pattern to be printed is reduced to a minimum. For example, when the wire width is reduced to a minimum, the fine dust trapped in the meshes of the screen may cut off the thick-film paste pattern, resulting in poor electrical connections. Or, the presence of the stainless steel wires of the screen may produce uneven wire widths and wire thicknesses of the printed circuit pattern, thereby forming a cause for variation of electrical characteristics.

On the other hand, the thin-film technique involves an evaporation or sputtering process by which an electrical material is deposited on a substrate through the openings previously formed with a photosensitive resin. This technique can produce minute circuit patterns having a wire width of less than 100μ, as contrasted with the thick-film technique. In these days, however, circuit devices have come not only to have a minimized wire width but also to include a plurality of layers comprising electrically conductive layers separated by electrical insulation layers. The thin-film technique has been found to be unsuitable for the formation of such electrical insulation layers. More particularly, since the thermal expansion coefficient of an electrical insulating material is much lower than that of a metal, the electrically insulating layers formed by evaporation or sputtering are in danger of being cracked. The thick-film technique using a paste for thick-film circuit is free from the above-described danger because the thermal expansion coefficient of the paste can be controlled. It is therefore necessary to rely upon the thick-film technique for the manufacture of large-sized, multi-layer circuit device measuring, for example, 80 by 80 mm. However, the above-described difficulties in forming circuit patterns with a wire width of less than 100μ and holes of small diameter have been an impediment to further densification.

SUMMARY OF THE INVENTION

This invention has been made in order to overcome the above-described shortcomings of the prior art. An object of the invention is to manufacture, by making the most of the thick-film technique, a circuit device having a circuit pattern which is less than 100μ in wire width, has clear-cut side edges and is uniform in thickness.

Briefly stated, and in accordance with this invention, the foregoing object is accomplished by a method of manufacturing thick-film circuit device which comprises using a photosensitive resin to form a predetermined thick-film paste pattern and then firing said paste pattern.

According to one embodiment of the invention, there is provided a method of manufacturing thick-film circuit device which comprises depositing a paste material for thick-film circuit all over the effective surface area of a substrate and drying said paste material; depositing a photosensitive resin on said paste material; exposing said photosensitive resin selectively to light; removing the unnecessary parts of said photosensitive resin and of said paste material; and then firing said paste material attached to said substrate.

According to another embodiment of the invention, there is also provided a method of manufacturing thick-film circuit device which comprises depositing a photosensitive resin on a substrate; exposing said photosensitive resin selectively to light; removing the unnecessary parts of said photosensitive resin; filling a paste material for thick-film circuit use into the openings from which said photosensitive resin was removed; and then removing the remaining photosensitive resin and firing the filled paste material.

DETAILED DESCRIPTION OF THE INVENTION

Preferred embodiments of the invention will hereinafter be described in detail by reference to the accompanying drawings.

Although circuit device having a single layer of electrical insulating material are discussed in the following embodiments, the invention is not limited thereto. It will therefore be obvious to those skilled in the art that the invention can also be applied to multi-layer circuit device.

Figure 1:
FIGS. 1 through 5 are sectional views illustrating a sequence of steps in accordance with one embodiment of the invention.

Referring first to FIG. 1, there is shown a ceramic substrate 1. That area of the top surface of ceramic substrate 1 which can be effectively used as a circuit device is totally coated with an electrically insulating paste material 2. For this purpose, the coating technique using an overall previous screen with no pattern formed therein or other suitable coating techniques such as spin coating may be employed. Since the electrically insulating paste material 2 is deposited all over the top surface of ceramic substrate 1 as shown in FIG. 1, the ceramic substrate 1 may have for larger dimensional tolerances (for example, on warpage), as compared with the case in which fine wires are directly printed. Also, the electrically insulating paste material 2 may have physical properties, such as viscosity and thixotropy, suitable solely for deposition all over the top surface of ceramic substrate 1 and hence relatively large tolerances, as contrasted with the case in which fine wires are directly printed. Then, the electrically insulating paste material 2 deposited all over the top surface of ceramic substrate 1 is completely dried at 150° C. for 15 minutes so as to evaporate the thinners contained therein, for example, high-boiling organic solvents such as butyl carbitol, butyl cellosolve, ethyl acetate, etc. as well as water. As a result of this evaporation, the insulation layer 2 formed from the electrically insulating paste material becomes porous.

Figure 2:

On this insulation layer 2 is deposited a photosensitive resin, so that a photosensitive resin layer 3 is formed on the insulation layer 2 as illustrated in FIG. 2. In order to form the photosensitive resin layer 3, for example, a water-soluble photosensitive resin such as diazotized polyvinyl alcohol, acryloyl-containing compounds, etc. is applied to the insulation layer 2 by means of any suitable device such as spinner. Prior to this application of a photosensitive resin, the porous insulation layer 2 is preferably allowed to absorb a sufficient quantity of water in order to prevent the production of air bubbles. Thereafter, the photosensitive resin layer 3 is slowly dried at 40°-50° C. so as to diffuse a part of the photosensitive resin into the porous insulation layer 2. In the subsequent etching step, this will serve to prevent the side walls of etched parts from crumbling (that is, to prevent side etching) because the parts exposed to light will be endowed with resistance to etching. The photosensitive resin layer 3 should be adjusted to a thickness of, for example, 5–10$\mu$ by controlling the viscosity of the photosensitive resin and the operating conditions of the spinner. Alternatively, the photosensitive resin layer 3 may be formed by preparing a dry film composed of a suitable film, such as polyester film, having the photosensitive resin deposited thereon to a desired thickness and then thermally bonding the dry film to the insulation layer 2.

Figure 3:
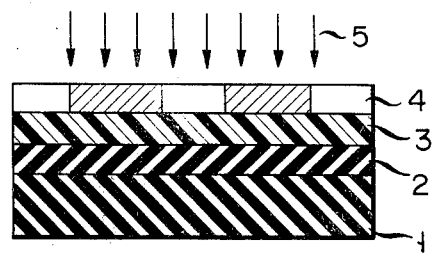
Figure 4A:
Figure 4B:

Thereafter, a film 4 containing a predetermined circuit pattern as a negative or a positive image is placed on the top surface of photosensitive resin layer 3 as illustrated in FIG. 3, and then irradiated with, for example, ultraviolet rays 5 whereby the photosensitive resin layer 3 is selectively exposed to light. Whether the film 4 should contain a negative or a positive image depends on the type, negative or positive, of the photosensitive resin. Subsequently to this exposure to light, the photosensitive resin layer 3 is treated with a suitable developing solution which is selected according to the type of the photosensitive resin. Specific examples of the photosensitive resin and of the developing solution capable of dessolving it will be apparent to those skilled in the art. For example, water is used for diazotized polyvinyl alcohol and trichloroethylene or tetrachloroethylene for acryloyl-containing compounds. The developing solution may be suitably selected in consideration of the simultaneous etching of the underlying insulation layer 2, the accuracy of the circuit pattern, etc. FIGS. 4(a) and 4(b) illustrate the assembly having been developed in two different cases. FIG. 4(a) corresponds to the case in which the photosensitive resin layer 3 was formed by using the above-described dry film, showing the selective removal of the photosensitive resin layer 3 alone. In this case, the exposed parts of the underlying insulation layer 2 must be removed in a subsequent etching step. Generally, paste materials for thick-film circuit use contain ethyl cellulose or its homologues as a binder and, therefore, are highly soluble in chlorinated hydrocarbon solvents such as trichloroethylene, dichloromethane, etc. and some ester solvents. With such a solvent, the insulation layer 2 is selectively removed, for example, by a spraying process or in an ultrasonic cleaning bath. FIG. 4(b) corresponds to the case in which the photosensitive resin layer 3 was formed by applying a water-soluble photosensitive resin. In this case, both the photosensitive resin layer 3 and the underlying insulation layer 2 are selectively removed as a result of treatment with a developing solution which can dissolve both of them. The reason why the photosensitive resin layer 3 and the insulation layer 2 can be removed simultaneously is that, as described above, a part of the photosensitive resin has diffused into the insulation layer. This embodiment of the invention is preferred when the formation of a minute circuit pattern is required. For this purpose, alcohols may be used as a solvent.

Finally, after the remaining parts of the photosensitive resin layer 3 are removed, or while they are left as they are, the assembly is fired. Generally, paste materials for thick-film circuit use are fired at 700°–1000° C. If the assembly is fired in an oxidizing atmosphere such as air, it is unnecessary to remove the remaining parts of the photosensitive resin layer 3 in advance. The reason for this is that, when heated at elevated temperatures of, for example, 800°–1000° C. in a full supply of oxygen, any organic material will be decomposed without producing any residual carbon.

Figure 5:

Now, as illustrated in FIG. 5, the ceramic substrate 1 has a predetermined pattern of insulation layer 2 formed thereon.

Thus, the method of this invention enables one to manufacture circuit device having a highly accurate circuit pattern without using the conventional screen printing method and by making the most of the advantages of thick-film elements. That is, while the conventional screen printing method can produce a wire width of 100$\mu$ or greater, circuit patterns having a wire width of down to 50$\mu$ can be formed in accordance with this invention. In addition, owing to the elimination of the screen, a uniform thickness and clearcut side edges of each wire can be produced so as to give sharp circuit patterns. Furthermore, while the conventional screen printing method requires special equipment and much time for the preparation of screens and the printing of circuit patterns, this invention makes it possible to form minute circuit patterns by means of simple equipment. In the practice of this invention, no inorganic compounds, salts, or ions are used throughout the manufacturing process, but organic compounds and solvents are exclusively used as a binder or a photosensitive material. This eliminates the occurrence of any residual ion, salt, or metal and thereby improves the reliability of the resulting circuit devices. The paste materials for thick-film circuit use which can be employed in the practice of this invention include electrically insulating paste materials, electrically conductive paste materials, and other circuit members such as resistive paste materials. However, the above-described embodiment of the invention is particularly useful for the purpose of forming an insulation layer from an electrically insulating paste material. That is, this embodiment is such that a paste material for thick-film circuit is deposited all over the surface of a ceramic substrate and the unnecessary parts of the paste material are removed to form a pattern from the remaining paste material. Thus, it is uneconomical to form an electrically conductive pattern, because the greater part of the paste material containing an expensive noble metal is discarded. On the other hand, the cost of material losses is not worth due consideration in the case of forming an insulation layer. Nevertheless, the above-described embodiment of the invention is still advantageous in that minute electrically conductive patterns can be formed by making the most of the thick-film technique.

Next, another preferred embodiment of the invention is described by reference to the accompanying drawings. Briefly stated, this embodiment involves depositing a photosensitive resin on a substrate, exposing the photosensitive resin selectively to light and treating it with a developing solution, filling a paste material for thick-film circuit use into the openings so formed, removing the photosensitive resin, and then firing the thick-film pattern formed of the paste material. A more detailed description is given below with reference to each of the steps.

Figure 6:
FIGS. 6 through 11 are sectional views illustrating a sequence of steps in accordance with another embodiment of the invention.

Referring now to FIG. 6, there is shown a substrate 10, such as ceramic substrate, on which a circuit pattern is to be formed. All over the top surface of this ceramic substrate 10 is deposited a photosensitive resin 11 to a predetermined thickness. In order to deposite the photosensitive resin 11, a water-soluble photosensitive resin such as diazotized polyvinyl alcohol, acryloyl-containing compounds, etc., is applied to a predetermined thickness by means of a device such as spinner. Alternatively, a dry film composed of a polyester film having a photosensitive resin deposited thereon to a predetermined thickness may be attached to the ceramic substrate 10 by hot pressing. The layer of photosensitive resin 11 formed on the ceramic substrate 10 as a result of the deposition of a photosensitive resin should be adjusted to a predetermined thickness with much care, because its thickness has a direct influence on the thickness of the layer of paste material; which will be formed later. Thereafter, the photosensitive resin 11 is dried.

Figure 7:
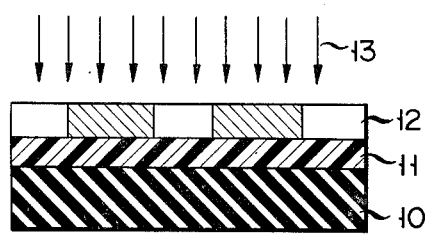
Figure 8:

As illustrated in FIG. 7, a film 12 containing a predetermined pattern as a negative or positive image is placed on the layer of photosensitive resin 11 formed on the ceramic substrate 1, and then irradiated with, for example, ultraviolet rays 13 whereby the photosensitive resin 11 is selectively exposed to light. Subsequently to this exposure to light, the photosensitive resin 11 is treated with a suitable developing solution in the same manner as described in connection with the foregoing embodiment. FIG. 8 illustrates the assembly having been developed. As a result of the selective removal of the photosensitive resin 11, openings 14 are formed in the layer of photosensitive resin 11.

Figure 9:
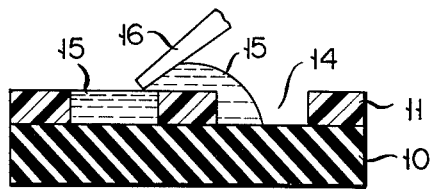
Figure 10A:
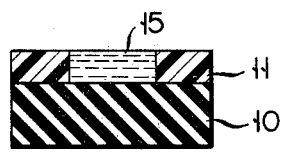
Figure 10B:

Then, as illustrated in FIG. 9, a paste material 15 for thick-film circuit use is filled into the opengins formed in the layer of photosensitive resin 11. For this purpose, a squeegee 16 made of rubber or plastics having a high degree of hardness (90 or higher) is used to force the paste material 15 slowly into the openings 14. The paste materials for thick-film circuit which can be used in the practice of the invention comprise powdered noble metals such as gold, palladium, platinum, silver, etc., powdered glass, and the like. The selection of a suitable paste material will be easy because printing characteristic as was required by the conventional screen printing method need not be taken into consideration. Thereafter, the paste material 15 which has been filled into the openings 14 is dried. FIGS. 10(a) and 10(b) illustrate the assembly before and after drying, respectively. If, as illustrated in FIG. 10(b), the volume of paste material 15 decreases after drying, the openings 14 are preferably re-filled with the paste material by repeating the above-described procedure for filling the paste material.

Figure 11:

After the paste material 15 has been filled into the opengins 14 formed in the layer of photosensitive resin 11, small quantities of the paste material my remain on the layer of photosensitive resin 11. If the assembly is fired as it is, the remaining paste material may cause a short circuit. It is therefore preferable to remove the photosensitive resin 11. Proper consideration should be given to the type of the solution used for its removal because the paste materials containing ethyl cellulose or its homologues as a binder are soluble in alcohols and chlorinated hydrocarbons. By way of example, methyl ethyl ketone and acetone can effectively dissolve the photosensitive resin 11 without destroying the paste material 15. After removal of the photosensitive resin 11, the paste material 15 deposited on the ceramic substrate 10 is fired at 700°–1000° C. in air. Now, as illustrated in FIG. 11, the ceramic substrate 10 has a predetermined pattern of paste material 15 formed thereon.

As illustrated above, circuit patterns having a wire width of down to 50μ can be formed in accordance with this invention. In addition, owing to the elimination of the screen, a uniform thickness and clear-cut side edges of each wire can be produced so as to give sharp circuit patterns. While this embodiment has been described with reference to a paste material for thick-film circuit use, it will be understood that the paste material is not limited to a specific type. As described in connection with the foregoing embodiment, the useful paste materials include electrically insulating paste materials, electrically conductive paste materials, and other circuit members. This embodiment is particularly useful for the purpose of forming an electrically conductive pattern from a paste material containing a noble metal. That is, this embodiment is economical because the paste material is used solely for filling in the openings formed in the layer of photosensitive resin and, therefore, is not wasted at all.

Although this invention has been described in detail with reference to only two embodiments thereof, it will be understood that circuit devices having a highly accurate and minute circuit pattern can been manufactured in accordance with this invention. That is, circuit patterns having a wire width of down to 50μ can be formed. In addition, a uniform thickness and clear-cut side edges of each wire can be produced so as to give sharp circuit patterns. While the conventional screen printing method requires special equipment and much time for the preparation of screens and the printing of circuit patterns, this invention makes it possible to form minute circuit patterns by means of simple equipment.

What we claim is:

1. A method of manufacturing a thick-film circuit device comprising:
    depositing a paste material for thick-film circuit use all over the effective surface area of a substrate and drying the paste material to evaporate a thinner contained in the paste material to make the paste material porous;

depositing a photosensitive resin on the paste material and drying the resin to partially diffuse the resin into the porous material;

exposing the photosensitive resin selectively to light;

removing the unnecessary parts of the photosensitive resin and of the paste material; and firing the paste material attached to the substrate.

2. A method as claimed in claim 1 wherein the removing step of the unnecessary parts of the photosensitive resin and of the paste material is effected simultaneously by treatment with an etching solution.

3. A method as claimed in claim 1 wherein, prior to the application of a photosensitive resin, the paste material is allowed to absorb a sufficient quantity of water for preventing air bubbles from subsequently being generated out of the paste material.

4. A method as claimed in claim 1 wherein the deposition of a photosensitive resin on said paste material is carried out by thermally laminating a dry film to said paste material, said dry film consisting of a film having said photosensitive resin deposited thereon.

5. A method as claimed in claim 1 wherein said paste material is an electrically insulating one.

6. A method as claimed in claim 1 wherein said photosensitive resin is soluble in water.

7. A method of manufacturing thick-film circuit devices which comprises using a photosensitive resin to form a predetermined thick-film paste pattern and then firing said paste pattern which comprises depositing a photosensitive resin on a substrate; exposing said photosensitive resin selectively to light; removing the unnecessary parts of said photosensitive resin thereby forming openings; filling a paste material for thick-film circuit use into the openings from which said photosensitive resin was removed; and then removing the remaining photosensitive resin and firing the filled paste material.

8. A method as claimed in claim 7 wherein said paste material is an electrically conductive one.

9. A method as claimed in claim 7 wherein the filling of a paste material for thick-film circuit use is carry out by forcing said paste material into said openings with a squeegee.

10. A method as claimed in claim 7 wherein the filling of a paste material for thick-film circuit use is carried out by filling and drying said paste material and then repeating the same procedure.

11. A method as claimed in claim 7 wherein said photosensitive resin is soluble in water.

12. A method as claimed in claim 7 wherein the deposition of a photosensitive resin on a substrate is carried out by thermally laminating a dry film to said substrate, said dry film consisting of a film having said photosensitive resin deposited thereon.

13. A method as claimed in claim 7 wherein said paste material is an electrically insulating one.

* * * * *